United States Patent
Moidron

(10) Patent No.: US 8,022,675 B2
(45) Date of Patent: Sep. 20, 2011

(54) DETECTION OF THE SUPPLY STATE OF A LOAD SUPPLIED BY A VARIABLE VOLTAGE

(75) Inventor: Laurent Moidron, Notre Dame d'oé (FR)

(73) Assignee: STMicroelectronics S.A., Montrouge (FR)

( * ) Notice: Subject to any disclaimer, the term of this patent is extended or adjusted under 35 U.S.C. 154(b) by 294 days.

(21) Appl. No.: 11/966,246

(22) Filed: Dec. 28, 2007

(65) Prior Publication Data

US 2008/0157784 A1    Jul. 3, 2008

Related U.S. Application Data

(63) Continuation of application No. 11/216,919, filed on Aug. 31, 2005, now abandoned.

(51) Int. Cl.
*H02J 7/00* (2006.01)
*H02J 7/04* (2006.01)

(52) U.S. Cl. ........ 320/143; 320/121; 320/134; 320/129; 320/136; 320/155; 324/426; 324/428; 324/433

(58) Field of Classification Search ............ 324/555, 324/426, 428, 433; 320/121, 118, 134, 127, 320/129, 128, 143, 135, 148, 136, 149, 155
See application file for complete search history.

(56) References Cited

U.S. PATENT DOCUMENTS

| | | | |
|---|---|---|---|
| 4,585,987 A | 4/1986 | Prue, Jr. et al. | |
| 4,628,397 A | 12/1986 | Gareis et al. | |
| 5,329,223 A * | 7/1994 | Riggio | 323/246 |
| 5,694,310 A * | 12/1997 | Malik et al. | 363/84 |
| 5,808,445 A * | 9/1998 | Aylor et al. | 320/132 |
| 5,933,336 A * | 8/1999 | Jiang et al. | 363/44 |
| 5,982,644 A * | 11/1999 | Hulsey et al. | 363/26 |
| 6,069,801 A * | 5/2000 | Hodge et al. | 363/21.02 |
| 6,081,123 A | 6/2000 | Kasbarian et al. | |
| 6,154,473 A * | 11/2000 | Watanabe | 372/38.02 |
| 6,300,763 B1 * | 10/2001 | Kwok | 324/427 |
| 6,456,988 B1 * | 9/2002 | Singh et al. | 706/2 |
| 6,919,733 B2 * | 7/2005 | Kamitani | 324/760 |
| 7,525,284 B2 * | 4/2009 | Iwane et al. | 320/132 |
| 2005/0062458 A1 * | 3/2005 | Koch et al. | 320/132 |
| 2005/0164047 A1 * | 7/2005 | Mondry | 429/13 |

OTHER PUBLICATIONS

French Search Report from corresponding French Application No. 0451944 filed Aug. 31, 2004.

* cited by examiner

*Primary Examiner* — Edward Tso
*Assistant Examiner* — Alexis Boateng
(74) *Attorney, Agent, or Firm* — Lisa K. Jorgenson; James H. Morris; Wolf, Greenfield & Sacks, P.C.

(57) ABSTRACT

A method and a circuit for detecting the state of supply of a load by a variable voltage, including measuring the difference between values representative of the variable supply voltage and of a voltage across the load.

22 Claims, 4 Drawing Sheets

DETECTION OF THE SUPPLY STATE OF A LOAD SUPPLIED BY A VARIABLE VOLTAGE

CROSS REFERENCE TO RELATED APPLICATIONS

This application is a continuation of U.S. application Ser. No. 11/216,919, filed Aug. 31, 2004 entitled DETECTION OF THE SUPPLY STATE OF A LOAD SUPPLIED BY A VARIABLE VOLTAGE, which application is incorporated herein by reference in its entirety.

BACKGROUND OF THE INVENTION

1. Field of the Invention

The present invention generally relates to the detection of the supply state of a load supplied by a variable voltage (A.C. or unipolar) and more specifically the supervision of the state of this load and of one or several switches controlling it.

The present invention more specifically applies to the detection of possible failures of the load or of switches in series with this load.

2. Discussion of the Related Art

FIG. 1 shows a conventional example of an assembly of supervision of the state of a load Q supplied by an A.C. voltage Vac under control of two switches T and SW. This example relates to the control of the motor (load Q) of a washing machine under the action of a first switch formed of a triac T receiving a control signal CT from a programmer (not shown). A second switch SW symbolizes a door-opening detection contact of the machine to interrupt the motor supply in case of an opening (turning-off of switch SW). Triac T is in series with load Q and switch SW between two terminals 1 and 2 of application of A.C. voltage Vac (generally, the electric distribution mains voltage).

The supervision of the respective states of the motor and of the switches is performed by analyzing the voltage at point 3 of interconnection of triac T and of motor Q. Two resistors R1 and R2 (generally of identical values) are respectively connected between terminal 2 and node 3, and between node 3 and a node 4 for sampling an analog measurement voltage Van. Voltage Van is applied to input IN of an analog-to-digital converter 5 (ADC). Converter 5 is supplied by a D.C. voltage Vdc, applied between terminals 6 and 7, which is low as compared with A.C. voltage Vac (typically 5 to 10 volts, to be compared with 110 or 220 volts). To provide a voltage Van of relatively low level with respect to voltage Vac, node 4 corresponds to the midpoint of a resistive dividing bridge, formed of two resistors RH and RL generally of the same value, in series between terminals 6 and 7. Accordingly, the quiescent level of the converter approximately corresponds to half voltage Vdc (Vdc/2). Voltage reference input VREF of converter 5 is connected to terminal 6 and its digital inputs are intended to be interpreted, for example, by a microprocessor or microcontroller PC (not shown). In the example shown, an 8-bit converter is considered.

The selection of node 3 to supervise the analog voltage across the load enables reading several voltages according to the respective states of switches T and SW.

FIG. 2 shows examples of shapes of analog voltage Van along time in a period of A.C. supply voltage Vac.

When triac T is on, whatever the state of switch SW, voltage Vac is found at node 3 and at node 6. Accordingly, voltage Van remains constant at quiescent median value MED of the converter (full line TON in FIG. 2).

When triac T is off, voltage Van follows an A.C. course having its amplitude depending on the other states.

If, the triac being off, switch SW is on, load Q which exhibits in normal operation a low impedance with respect to resistor R1 brings, in a way, node 3 to the voltage of node 2. Sinusoidal voltage Van (dotted line SWONLOK in FIG. 2) varies between a voltage THH slightly smaller than voltage Vdc and a voltage THL slightly greater than ground. Difference Vdc−VTH corresponds to the minimum voltage drop in resistor RH. Level THL corresponds to the minimum voltage drop in resistor RL.

If, the triac being off, switch SW is also off, a sinusoid (shape in full line LDEF) of amplitude smaller than that of the preceding operation (shape SWONLOK) is found on input IN of converter 5. This case also corresponds to the case where switch SW is on, while load Q is defective, that is, it exhibits an impedance greater than that of its normal operation.

In the case where switch SW is correctly on but triac T is defective, that is, it has a diode behavior, voltage Van has a median level MED in one halfwave and, in the other halfwave, follows previously-described shape SWONLOK. This shape of defective triac T is shown by a stripe-dot line TDEF in FIG. 2.

Finally, if voltage Van remains constant at a level comprised between threshold THH and voltage Vdc, this means that resistor RL is broken (off circuit). Similarly, if voltage Van remains constantly under threshold THL, this means that resistor RH is broken.

A problem of conventional circuits for supervising the state of a load and of its switches is linked to the tolerances of the different components and mainly to the possible variations of the voltage reference of converter 5 which is provided by voltage Vdc, likely not to have a perfect stability.

Such imperfections result in that the different cases of operation described in relation with FIG. 2 are likely to translate as sinusoids strongly different from one another.

FIG. 3 illustrates, in the case of an A.C. voltage of a 50-Hz frequency, the possible ranges of variation of the different shapes.

To be able to exploit the results of the detection, voltage Van is compared with threshold voltages, and more specifically the digital outputs of converter 5 are compared with digital values. In addition to thresholds THH and THL, intermediary thresholds THIHH and THIHL are set between threshold THH and median value MED, and thresholds THILH and THILL are set between the median value and threshold THL.

If voltage Van ranges, in positive halfwaves, between thresholds THIHH and THH and, during negative halfwaves, between thresholds THIHL and THL, this means (SWONLOK) that the triac is off while switch SW is on, the load being normal.

If voltage Van ranges, in one of the two halfwaves, between thresholds THIHH and THH or THILL and THL, and remains between thresholds THILL and THILH in the other halfwaves, this means (TDEF) a malfunction of the triac which does not turn on one halfwave out of two (or which is defective in diode mode).

If voltage Van ranges, in positive halfwaves, between thresholds THILH and THIHH and, in negative halfwaves, between thresholds THILL and THIHL, this means (LDEF) that switch SW and triac T are off, or that switch SW is on (triac T off) and that the load is defective.

If voltage Van constantly is between thresholds THIHL and THILL, this means (TON) that the triac is on.

If voltage Van is constantly between thresholds THH and Vdc or smaller than threshold THL, this indicates a defect of the measurement circuit.

The above tests are only valid at given times of the halfwaves. Indeed, the A.C. shape of the measured signal Van and the possible variation ranges of these shapes result in that, in practice, a possible detection time window is limited to each halfwave in the vicinity of the maximum of this halfwave. In the example of FIG. 3 applied to a 50-Hz frequency, it can be seen that the possible detection window (W) is of approximately 2 milliseconds around the maximum of each halfwave.

A disadvantage is that there are significant risks of false detection in case of a loss of synchronism of the measurement or in case of a distortion of voltage Vac (wrong shape factor).

Another disadvantage is that the possibility of performing a single measurement per half period slows down the detection. The reliability of the detection thus is sensitive to a possible variation of A.C. voltage Vac.

Another disadvantage is that a circuit of supervision of the load state is not transposable without modifications to a mains voltage of different frequency or amplitude.

SUMMARY OF THE INVENTION

The present invention aims at providing a method for detecting the state of a load supplied by a variable voltage (A.C. or unipolar) or of at least one switch controlling this load, which overcomes at least some disadvantages of known solutions.

The present invention especially aims at providing a solution which is freed of the tolerances of the components forming the detector.

The present invention also aims at providing a solution which is not sensitive to variations of the D.C. voltage.

The present invention also aims at providing a solution which operates for different supply voltage frequencies and amplitudes, with no modification, and which is not sensitive to the shape factor of the non-D.C. supply voltage.

The present invention also aims at providing a circuit for supervising the state of a load and of at least one switch controlling it, implementing this detection method.

The present invention also aims at providing a solution avoiding use of an analog-to-digital converter.

To achieve these and other objects, the present invention provides method for detecting the state of supply of a load by a variable voltage, comprising measuring logarithmic values representative of the variable supply voltage and of a voltage across the load, and calculating the difference between said logarithmic values.

According to an embodiment of the present invention, said values are logarithmic.

According to an embodiment of the present invention, an analog voltage representing said difference is compared with predetermined characteristic operation thresholds of the circuit.

According to an embodiment of the present invention, the times when said analog voltage is taken into account are synchronized on the variable supply voltage.

According to an embodiment of the present invention, an absolute value of an analog voltage representing said difference is compared with predetermined characteristic operation thresholds of the circuit.

According to an embodiment of the present invention, said absolute value is averaged before being compared with said thresholds.

According to an embodiment of the present invention, the variable supply voltage is an A.C. voltage.

According to an embodiment of the present invention, the variable supply voltage is a non-D.C. unipolar voltage.

The present invention also provides a circuit for supervising the state of supply of a load by a variable voltage in series with at least one first switch, comprising means for measuring values representative of the variable voltage and a voltage across the load and for making logarithmic said values, and an element for calculating the difference between said logarithmic values.

According to an embodiment of the present invention, a second switch is in series with the load and the first switch.

According to an embodiment of the present invention, the circuit comprises an element for calculating the absolute value of the output voltage of said element for calculating the difference.

According to an embodiment of the present invention, said absolute value is averaged.

According to an embodiment of the present invention, the circuit comprises at least one comparator with at least one characteristic operation threshold of the assembly.

The foregoing and other objects, features, and advantages of the present invention will be discussed in detail in the following non-limiting description of specific embodiments in connection with the accompanying drawings.

DETAILED DESCRIPTION

Figure 1:
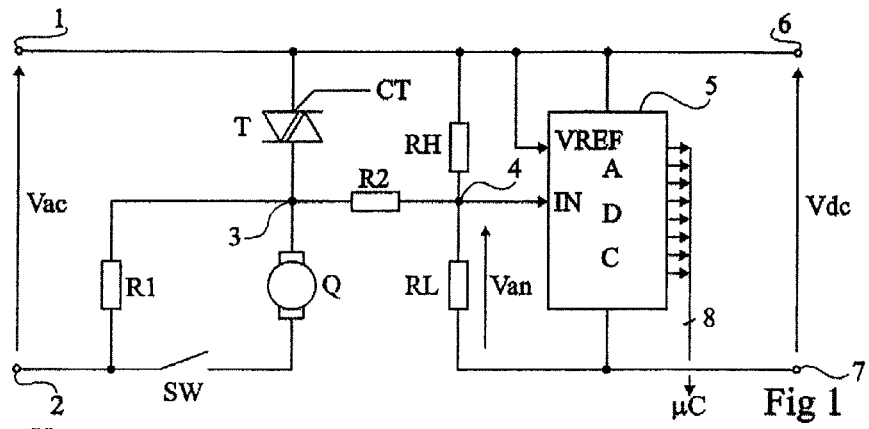
FIGS. 1, 2, and 3, previously described, are intended to show the state of the art and the problem to solve.
Figure 2:
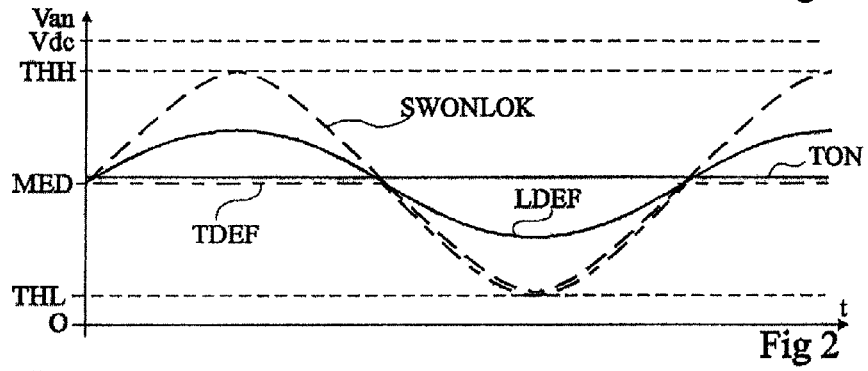
Figure 3:
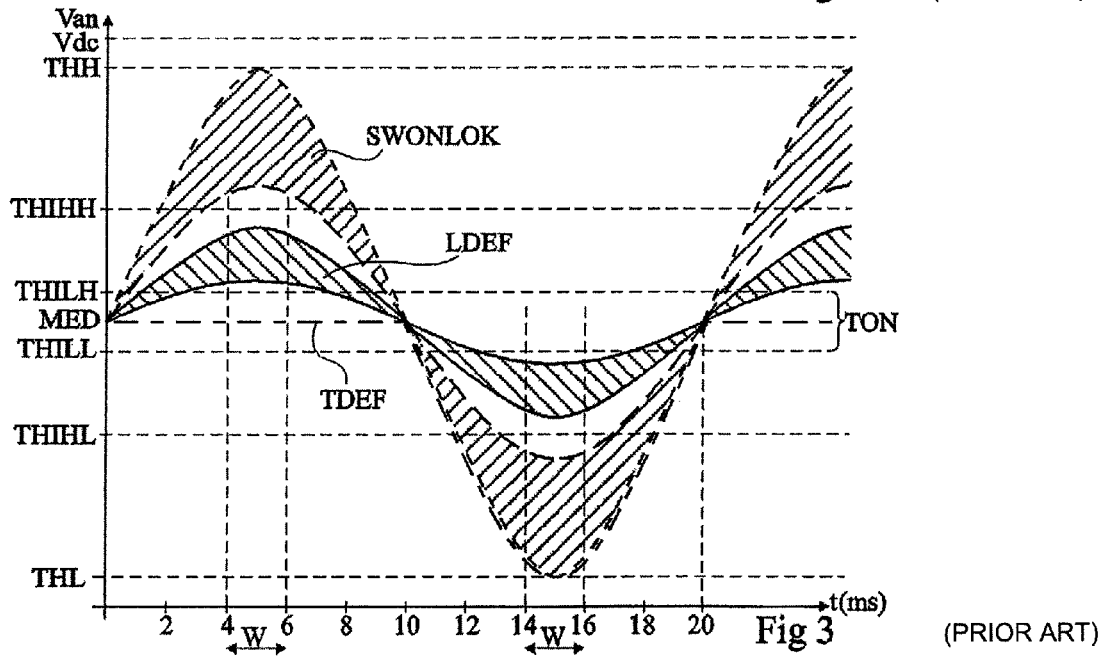

The same elements have been designated with the same reference numerals in the different drawings. For clarity, only those method steps which are necessary to the understanding of the present invention have been shown and will be described hereafter. In particular, the exploitation of the measurements has not been described in detail, the present invention being compatible with any conventional exploitation of these measurements. Further, the present invention applies whatever the type of load, the operation of which is desired to be detected, provided for said load to have, in normal operation, a relatively low impedance.

The difference between values representative of the voltage across the load and the variable supply voltage is calculated. "Variable" is used to designate a non-D.C. voltage, that is, an A.C. or modulated unipolar voltage. As will be seen hereafter, this voltage is not necessarily periodic.

Figure 4:
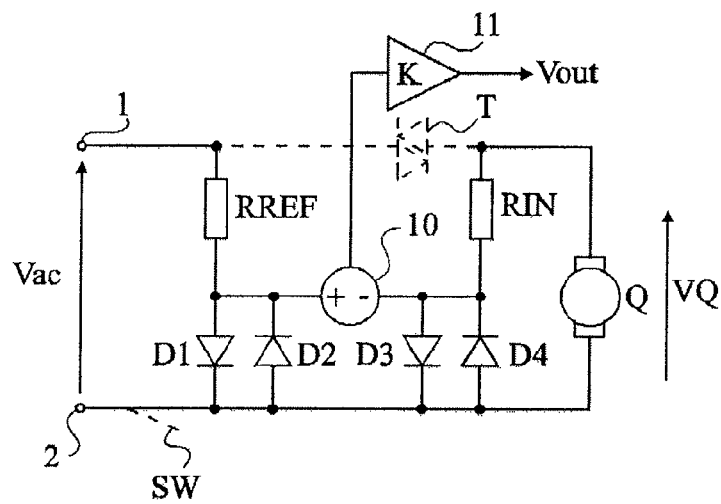
FIG. 4 schematically and functionally illustrates the detection method according to the present invention.

FIG. 4 schematically and functionally illustrates an embodiment of the method for detecting the supply state of a load supplied by an A.C. voltage Vac. "Detection of the supply voltage of a load" is used to designate the detection not only of the load state, but also of one or several switches which control it. Load Q is, as previously, series-connected between switches T and SW between terminals 1 and 2 of application of voltage Vac. In FIG. 4, control switches T and SW of the load have been shown in dotted lines. Indeed, the method of the present invention may apply even in the absence of switches or in the presence of a single switch in series with the load.

The difference between the instantaneous values of A.C. supply voltage Vac provided by the mains and of voltage VQ across load Q is calculated. As an alternative, the opposite difference is calculated.

According to a preferred embodiment of the present invention, two diodes D1 and D2 are connected in anti-parallel between an input terminal of element 10 and terminal 2. Further, two diodes D3 and D4 are connected in antiparallel between the other input terminal of element 10 and a terminal of the load. To limit the current, a resistor RREF connects terminal 1 to the non-inverting input of element 10 and a resistor RIN connects the second terminal of load Q to its inverting input. The result provided by element 10 is amplified, by amplifier 11, with a constant gain K to provide an analog signal Vout representative of the load supply state.

Diodes D1 to D4 are used to make the variation of the voltages at the input of element 10 logarithmic. Thus, voltage Vout may be expressed as follows:

$$Vout = K \cdot Ln(VQ/Vac).$$

Measured voltage Vout is thus independent from possible variations of the relatively low D.C. measurement element supply voltage Vdc, from variations of the frequency and of the amplitude of A.C. supply voltage Vac, and from the shape factor of this voltage Vac. Further, as will be seen in relation with FIG. 6, the obtained waveforms are flattened due to diodes D1 to D4.

Figure 5:
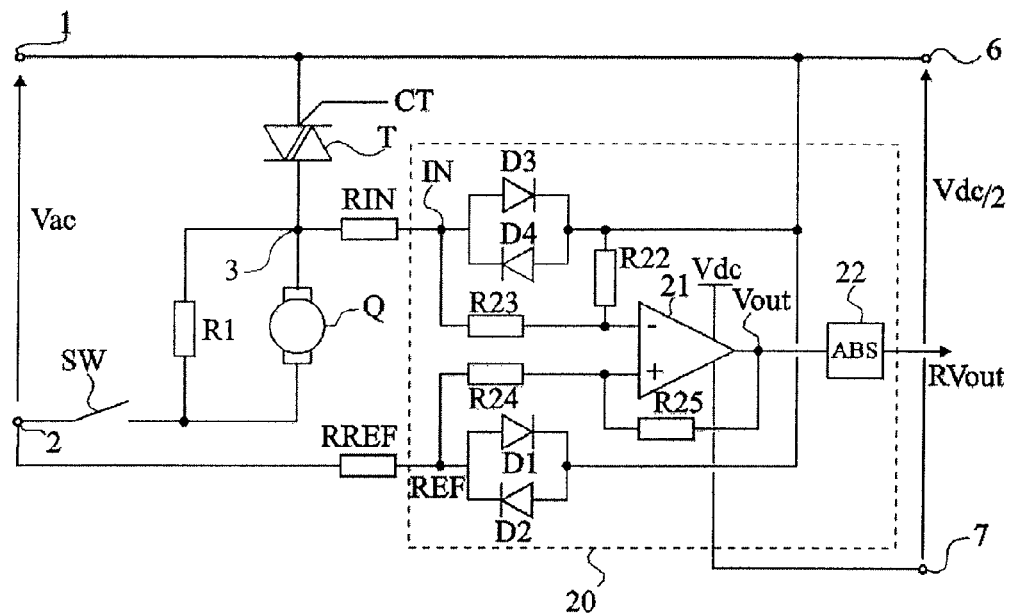
FIG. 5 shows an embodiment of a circuit for detecting the supply state of an A.C. load according to the present invention.

FIG. 5 shows an example of assembly for the implementation of the method of the present invention in an example of application identical to that previously described in relation with FIG. 1.

Triac T, load Q, and switch SW can be found in series between terminals 1 and 2 on which is applied A.C. supply voltage Vac.

According to a first embodiment, not shown, resistor R1 between terminals 3 and 2, and a resistor RIN connected to an input terminal IN of a measurement circuit 20 can be found.

According to a second shown embodiment, resistor R1 is placed in parallel only with the load and resistor RIN connects load 3 to input terminal IN of measurement circuit 20. The difference on the detected states will be discussed in relation with FIG. 6.

Resistor R1 corresponds to the resistor which, for the application of the present invention, conditions the relatively low impedance of the load. In fact, load Q must have, in normal operation, an impedance smaller than resistor R1.

Unlike the conventional case, resistors R1 and RIN are different from each other. Resistor R1 preferably is of high value with respect to resistor RIN. Further, resistor RIN preferably is of same value as resistor RREF, which connects terminal 2 to a reference input REF of circuit 20.

In the example of FIG. 5, the difference calculation element is formed of an operational amplifier 21 supplied by a D.C. voltage Vdc relatively low with respect to voltage Vac. A D.C. voltage equal to Vdc/2 is further applied between terminals 6 and 7, terminal 6 being directly connected to terminal 1 to form a common voltage node with voltage Vac, and terminal 7 corresponding to ground on the D.C. voltage side. The inverting input of amplifier 21 is connected, by a resistor R22, to the cathode of diode D3 and to the anode of diode D4 and, by a resistor R23, to measurement input IN. The non-inverting input of amplifier 21 is connected by a resistor R24 to reference input REF of circuit 20 and by a resistor R25 to the output of amplifier 21. The anode of diode D1 and the cathode of diode D2 are connected to input REF. The cathode of diode D1, the anode of diode D2, the cathode of diode D3, and the anode of diode D4 are connected to terminal 6. The output of amplifier 21 is applied to an absolute value calculation circuit 22 providing a rectified voltage RVout.

According to an alternative embodiment, element 22 is omitted. Voltage Vout provided by amplifier 21 is then analyzed by taking into account the periodicity of voltage Vac. An advantage of analyzing absolute value RVout of voltage Vout is that this enables applying the present invention to non-periodic voltages.

According to another alternative embodiment, the input stages of amplifier 21 are replaced with two analog-to-digital converters. However, this is not a preferred embodiment since that of FIG. 5 is of simpler implementation.

Figure 6:
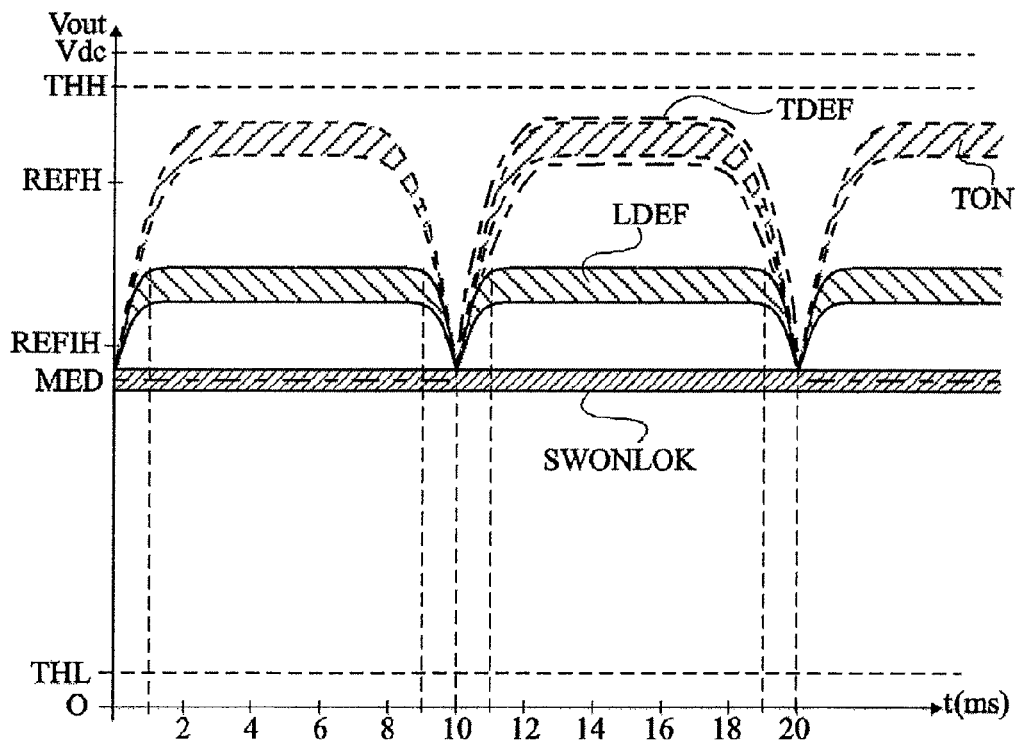
FIG. 6 illustrates, in a timing diagram, the operation of the circuit of FIG. 5.

FIG. 6 illustrates the shape of voltage RVout provided by element 22 in different cases of operation.

Thresholds MED and THH are defined, for example as previously, and thresholds REFIH and REFH are defined between levels MED and THH. Thresholds REFIH and REFH may correspond in value to preceding thresholds THILH and THIHH, respectively. However, their exploitation is different.

It should be noted that due to the rectification performed by element 22, the possible shapes of voltage RVout are always greater than value Vdc/2.

If voltage RVout remains at a value ranging between threshold THH and voltage Vdc, this indicates a defect in one of the input stages of comparator 21 or that one of resistors RIN and RREF is broken.

If voltage RVout crosses, on each halfwave, a value greater than threshold REFH, this means that the triac is on whatever the states of the other elements. In the case shown in FIG. 5 where resistor R1 is in parallel with the sole load Q, this can also mean that triac T and switch SW are both off.

If voltage RVout follows shape TON one halfwave out of two and remains in the vicinity of voltage MED in the other halfwave, this means that triac T is defective and operates in a single direction.

If voltage RVout is steady in the vicinity of median voltage MED, this means that triac T is off, that switch SW is on, and that the load has a small impedance as compared to resistor R1.

If voltage RVout ranges between thresholds REFIH and REFH in all halfwaves, this means that triac T is off, that switch SW is on, and that the load is defective by exhibiting an impedance greater than normal values. In the case where resistor R1 is in parallel with the series connection of load Q and of switch SW, this may also mean that triac T and switch SW are both off.

It can thus be seen that, according to the position of resistor R1, different states can be distinguished. In the case of FIG. 5, this enables unambiguously identifying a defect in the load. In the case of the conventional position of FIG. 1, this enables unambiguously identifying a turning-on of triac T.

An advantage of the present invention in the embodiment using diodes D1 to D4 is that it considerably flattens the waveforms obtained on voltage Vout. Accordingly, the possible time windows of analysis of the analog shapes are considerably widened.

As a comparison, FIG. 6 reproduces an example applied to an A.C. voltage at the 50-Hz frequency and it can be seen that the possible analysis windows of voltage RVout with respect to the threshold voltages are considerably greater. For example, only two milliseconds around the zero crossings are to be excluded from the analysis window. Further, it can be seen hereafter that a permanent detection may even be performed.

According to a first exploitation mode of the measurement result, signal Vout or RVout is converted by an analog-to-digital converter before being exploited by a microcontroller or microprocessor.

According to a second embodiment of the present invention which will be described hereafter in relation with FIG. 7, voltage RVout is compared in parallel with the different thresholds to directly provide digital information about the operating state of the system.

Figure 7:
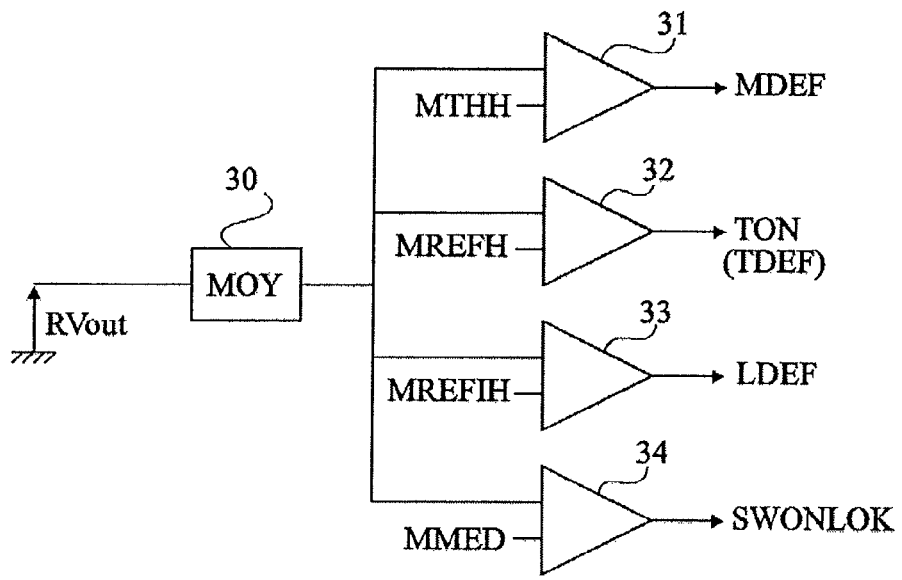
FIG. 7 shows an embodiment of a circuit for exploiting the measurement performed by the circuit of FIG. 5 without using an analog-to-digital converter.

In FIG. 7, voltage RVout is applied to an average value calculation circuit 30 for the case of a periodic voltage Vac. In fact, the average value of absolute value RVout of the difference between the voltage across the load and the supply voltage is considered, voltage RVout being provided, for example, by the circuit of FIG. 5. For example, averager 30 is formed of an RC cell having its time constant selected to approximately correspond to the period of voltage Vac. The output of circuit 30 is sent to first respective inputs of four comparators 31, 32, 33, and 34 having their respective second inputs receiving reference levels MMED, MREFIH, MREFH, and MTHH determined according to thresholds MED, REFIH, REFH, and THH. To simplify the following description, thresholds MMED, MREFIH, MREFH, and MTHH are considered to respectively correspond to thresholds MED, REFIH, REFH, and THH. In practice, thresholds MMED, MREFIH, MREFH, and MTHH will be determined by taking into account the possible level lowering linked to the averager function. It is arbitrarily assumed that each comparator provides an output in the high state when its threshold is exceeded. The opposite is of course possible.

If comparator 31 provides a high state, this means that threshold MREFH is exceeded, and thus that the measurement circuit is defective.

If comparator 32 provides a high state while comparator 31 provides a low state, this means that triac T is on, or that triac T and switch SW are off. According to the level of threshold MREFH, this may also mean a defect of the triac.

If comparator 33 provides a high state while comparators 31 and 32 provide low states, this means that the load is defective.

If only comparator 34 is in the high state, this means that, the triac being off, switch SW is on and the load is not defective.

Finally, if all the comparators provide low states, this indicates an absence of supply voltage Vac.

According to an alternative, a fifth comparator of comparison with a threshold ranging between levels MREFIH and MREFH is used to differentiate an on operation of the triac from a diode operation.

The binary states provided by the circuit of FIG. 7 enable direct interpretation by a microprocessor or a wired logic without for it to be necessary to use an analog-to-digital converter.

An advantage of this embodiment is that it enables a permanent detection, with no synchronization of the detection times with respect to A.C. voltage Vac.

A direct exploitation such as that of FIG. 7 is impossible with a conventional circuit due to the waveforms that it provides.

Another advantage of the present invention is that the detection is insensitive to the possible tolerances of D.C. voltage Vdc.

Another advantage of the present invention is that a same circuit can be used when the A.C. voltage varies in frequency and/or in amplitude. The margin is such in the differences between voltages that it is, in practice, not always necessary to modify the thresholds especially to switch from a voltage Vac of 110 V, 60 Hz to a voltage Vac of 230 V, 50 Hz.

Another advantage of the present invention in its preferred embodiment is that it avoids use of an analog-to-digital converter.

An advantage of the present invention is that the provided detection circuit is compatible with a detection under a variable power supply, be it A.C. or unipolar, periodic or aperiodic.

Another advantage of the present invention is that it enables instantaneous detection of the defects, without it being necessary to wait for the interpretation of synchronized measurements.

Figure 8:
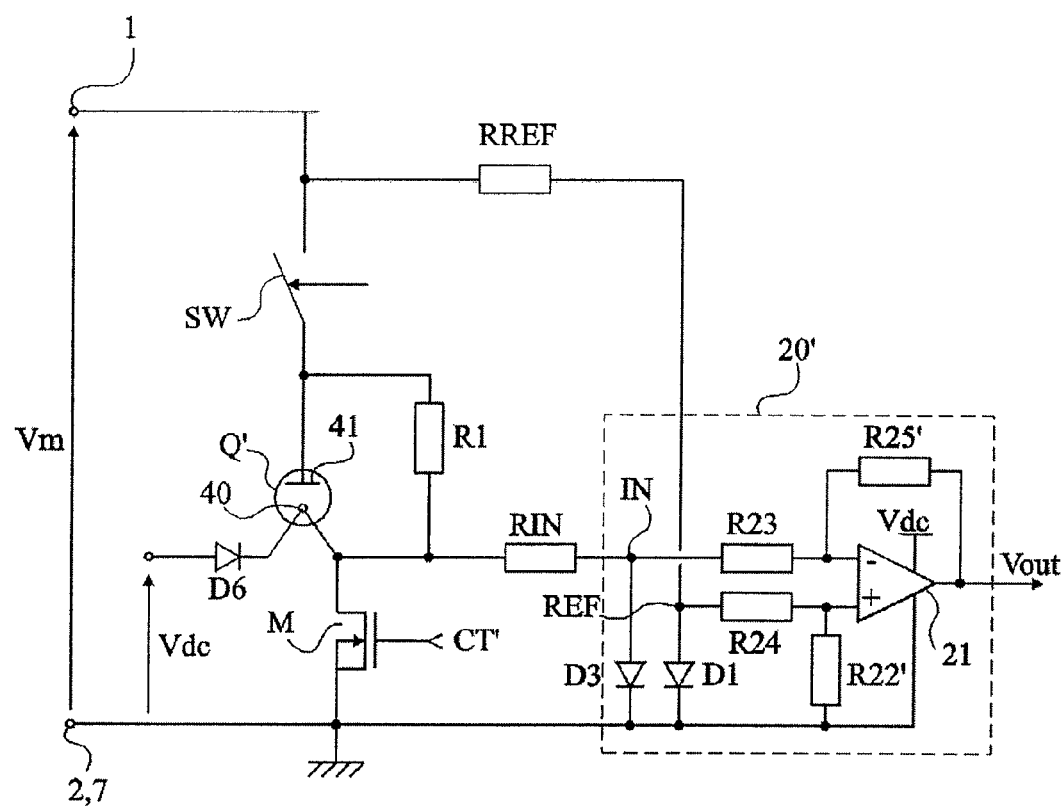
FIG. 8 shows an embodiment of a circuit for detecting the supply state of a load supplied by a variable unipolar voltage according to the present invention.

FIG. 8 shows the diagram of an embodiment of the present invention applied to a load supplied by a variable unipolar voltage. For example, the load is a magnetron Q' powered by a modulated voltage Vm applied between terminals 1 and 2, high with respect to a low supply voltage Vdc applied to its cathode 40 via a diode D6. A control switch M connects cathode 40 of the magnetron to ground 2 or 7 common to voltages Vm and Vdc, and receives a control signal CT'. Further, a security relay forms a switch SW between terminal 1 and anode 41 of magnetron Q'.

Circuit 20' of supervision of the supply state comprises an amplifier 21 examining the difference between the non-D.C. supply voltage Vm and the voltage across load Q'. A resistor R1 is in parallel with load Q'. A resistor RIN connects cathode 40 to input IN of circuit 20'. A resistor RREF connects terminal 1 to input REF of circuit 20'. Input IN is connected to the inverting input of comparator 21 by a resistor R23 and, by a diode D3, to ground 7. The inverting input is connected to the output providing voltage Vout by a resistor R25'. Input REF is connected to the non-inverting input by a resistor R24 and, by a diode D1, to ground 7. The non-inverting input is connected to ground 7 by a resistor R22'. Operational amplifier 21 forming the comparator is supplied by voltage Vdc.

Voltage Vout is compared with thresholds enabling detecting different conditions. The operation of the assembly of FIG. 8 can be deduced from the operations discussed in relation with the previous drawings.

Of course, the present invention is likely to have various, alterations, improvements, and modifications which will readily occur to those skilled in the art. In particular, the practical implementation of the circuit of the present invention is within the abilities of those skilled in the art according to the functional indications given hereabove and by using conventional components. Further, the threshold determination is also within the abilities of those skilled in the art according to the application and especially to the D.C. supply voltage.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:
1. A method for detecting, in a circuit, a state of supply of a load supplied by a variable supply voltage and coupled to at least one switch controlling the load, the method comprising:
measuring at least one logarithmic value representative of the variable supply voltage and at least one logarithmic value representative of a voltage across the load;

calculating a difference between said logarithmic values; and detecting at least one of the state of the supply of the load and a state of the at least one switch controlling the load based on the calculated difference, wherein the detecting comprises comparing the calculated difference with a plurality of thresholds.

2. The method of claim 1, wherein the difference is an analog voltage, and wherein the plurality of thresholds comprise predetermined characteristic operation thresholds of the circuit.

3. The method of claim 2, wherein said analog voltage is calculated at times that are synchronized on the variable supply voltage.

4. The method of claim 1, wherein the calculated difference is represented as an absolute value of an analog voltage, and wherein the plurality of thresholds comprise predetermined characteristic operation thresholds of the circuit.

5. The method of claim 4, wherein said absolute value is averaged before being compared with the plurality of thresholds.

6. The method of claim 1, wherein the variable supply voltage is an A.C. voltage.

7. The method of claim 1, wherein the variable supply voltage is a non-D.C. unipolar voltage.

8. A circuit for supervising a state of supply, by a variable supply voltage, of a load in series with at least one first switch, the circuit comprising:

means for measuring values of the variable supply voltage and of a voltage across the load and for making said measured values logarithmic; and an element for calculating a difference between said logarithmic values to identify at least one defect in at least one of the load and the at least one first switch based on the calculated difference, wherein identifying the at least one defect comprises comparing the calculated difference with at least one threshold.

9. The circuit of claim 8, further comprising a second switch that is in series with the load and the at least one first switch.

10. The circuit of claim 8, further comprising an element for calculating an absolute value of an output voltage of said element for calculating the difference.

11. The circuit of claim 10, wherein said absolute value is averaged.

12. The circuit of claim 8, further comprising at least one comparator for comparing the calculated difference with the at least one threshold comprising at least one characteristic operation threshold of the circuit.

13. The circuit of claim 8 configured to operate at the variable supply voltage of different frequencies and/or different amplitudes.

14. A circuit for supervising a state of supply of a load supplied by a variable voltage, wherein the load is in series with at least one first switch coupled between at least two terminals of application of the variable supply voltage, the circuit comprising:

at least one first component for measuring first values of the variable voltage and second values of a voltage across the load and for making the first and second values logarithmic; and at least one second component for calculating a difference between the first logarithmic values and the second logarithmic values to determine at least one of the state of the supply of the load and a state of the at least one first switch, wherein the determining comprises comparing the calculated difference with a plurality of thresholds.

15. The circuit of claim 14, wherein the at least one first component comprises a plurality of diodes that make the first and second values logarithmic.

16. The circuit of claim 15, wherein the plurality of diodes comprise:

a first and a second diodes coupled in anti-parallel between a first input terminal of the circuit and a terminal from the at least two terminals of application of the variable supply voltage; and a third and a fourth diodes coupled in anti-parallel between a second input terminal of the circuit and a terminal of the load.

17. The circuit of claim 15, wherein waveforms obtained on an output of the at least one second component are considerably flattened.

18. The circuit of claim 14, wherein a first resistor is coupled in parallel with the load and a second resistor is coupled between the load and an input terminal of the circuit.

19. The circuit of claim 17, wherein a value of the first resistor is higher than a value of the second resistor.

20. The circuit of claim 14, wherein the at least one second component comprises an operational amplifier.

21. The method of claim 1, wherein measuring the at least one logarithmic value representative of the variable supply voltage and the at least one logarithmic value representative of the voltage across the load comprises utilizing a plurality of diodes.

22. The method of claim 21, wherein the plurality of diodes comprise:

a first and a second diodes coupled in anti-parallel between a first input terminal of the circuit and a terminal from at least two terminals of application of the variable supply voltage; and a third and a fourth diodes coupled in-anti-parallel between a second input terminal of the circuit and a terminal of the load.

* * * * *

UNITED STATES PATENT AND TRADEMARK OFFICE
CERTIFICATE OF CORRECTION

| | | |
|---|---|---|
| PATENT NO. | : 8,022,675 B2 | Page 1 of 1 |
| APPLICATION NO. | : 11/966246 | |
| DATED | : September 20, 2011 | |
| INVENTOR(S) | : Laurent Moidron | |

It is certified that error appears in the above-identified patent and that said Letters Patent is hereby corrected as shown below:

On the Title Page, item (75) should read:
(75) Inventor: Laurent Moidron, Notre Dame d'Oe (FR)

Col. 1, line 55, should read:
or microcontroller µC (not shown). In the example shown, an Signed and Sealed this
Eighth Day of November, 2011

David J. Kappos
*Director of the United States Patent and Trademark Office*